United States Patent [19]

Kim

[11] Patent Number: 5,688,726

[45] Date of Patent: Nov. 18, 1997

[54] METHOD FOR FABRICATING CAPACITORS OF SEMICONDUCTOR DEVICE HAVING CYLINDRICAL STORAGE ELECTRODES

[75] Inventor: Suk Soo Kim, Kyoungki-do, Rep. of Korea

[73] Assignee: Hyundai Electronics Industries Co., Ltd., Kyougki-do, Rep. of Korea

[21] Appl. No.: 510,094

[22] Filed: Aug. 1, 1995

[51] Int. Cl.$^6$ ............................................. H01L 21/8242

[52] U.S. Cl. ............................................................. 438/397

[58] Field of Search ............................ 437/47, 52, 60, 437/195, 919; 148/DIG. 14

[56] References Cited

U.S. PATENT DOCUMENTS

| | | | |
|---|---|---|---|
| 5,164,337 | 11/1992 | Ogawa et al. | 148/DIG. 14 |
| 5,443,993 | 8/1995 | Park et al. | 437/60 |
| 5,491,103 | 2/1996 | Ahn et al. | 437/52 |

Primary Examiner—Chandra Chaudhari
Assistant Examiner—Toniae M. Thomas
Attorney, Agent, or Firm—Gary M. Nath; Nath & Associates

[57] ABSTRACT

A method for fabricating capacitors of a semiconductor device having a cylindrical storage electrode structure provided at its each side wall with a vertical groove for increasing the surface area of the storage electrode so that the semiconductor device has a sufficient capacitance. The method includes the steps of depositing a first conduction layer over a structure including a substrate and a contact hole, sequentially forming a first insulating film, a first conduction layer and a second insulating film, selectively growing the second insulating film, thereby forming a selectively-grown oxide film, sequentially etching the selectively-grown oxide film, the second insulating film and a predetermined portion of the first conduction layer, thereby forming a selectively-grown oxide film pattern, forming second-conduction layer spacers, third-conduction layer spacers and a first-conduction layer pattern, and removing the selectively-grown oxide film pattern, the first insulating film and the second insulating film pattern, whereby a cylindrical storage electrode with an increased surface area is formed.

6 Claims, 5 Drawing Sheets

METHOD FOR FABRICATING CAPACITORS OF SEMICONDUCTOR DEVICE HAVING CYLINDRICAL STORAGE ELECTRODES

BACKGROUND OF THE INVENTION

1. Field of the Invention

The present invention relates to a method for fabricating capacitors of a semiconductor device, and more particularly to a method for fabricating capacitors having a cylindrical storage electrode structure for providing an increased capacitance in highly integrated semiconductor devices.

2. Description of the Prior Art

Recent high integration trend of semiconductor devices inevitably involves a reduction in cell dimension. However, such a reduction in cell dimension results in a difficulty to form capacitors having a sufficient capacitance. This is because the capacitance is proportional to the surface area of capacitor. In a case of a dynamic random access memory (DRAM) device constituted by one metal oxide semiconductor (MOS) transistor and one capacitor, in particular, it is important to reduce the cell dimension and yet obtain a high capacitance of the capacitor, for the high integration of the DRAM device. For increasing the capacitance, various researches have been conducted. For example, there have been known use of dielectric films made of a dielectric material exhibiting a high dielectric constant, formation of thin dielectric layers, and formation of capacitors having an increased surface area.

However, all of these methods have their own problems, respectively. Although various materials, such as $Ta_2O_5$, $TiO_2$ or $SrTiO_3$, have been proposed as the dielectric material exhibiting a high dielectric constant, their reliance and thin film characteristics have not been confirmed. For this reason, it is difficult to practically use such dielectric materials for semiconductor devices. The reduction in thickness of dielectric layer results in damage of the dielectric layer severely affecting the reliance of the capacitor.

In order to increase the surface area of the capacitor, various capacitor structures have also been proposed. They include a fin structure, a labyrinthine structure with a cylindrical or rectangular shape, and a structure having hemispherical grain of silicon on storage electrode. In these capacitor structures, however, the capacitance is still insufficient because the surface area of the capacitor is still small due to its reduction caused by the high integration of DRAM.

Now, a capacitor having the conventional cylindrical structure will be described in conjunction with FIGS. 1A to 1D.

FIGS. 1A to 1D illustrate a conventional method for fabricating a semiconductor device.

In accordance with this method, a semiconductor substrate 25 is prepared and then a lower insulating layer 27 is formed on the semiconductor substrate 25 as shown in FIG. 1A. A predetermined portion of the lower insulating layer 27 is then removed using a contact mask (not shown), thereby forming a contact hole 30 through which the semiconductor substrate 25 is partially exposed. Over the resulting structure, a first conduction layer 29 is deposited so that it is in contact with the semiconductor substrate 25. A sacrificial film 31 is then coated over the first conduction layer 29. On the sacrificial film 31, a storage electrode mask 33 is formed. Between the lower insulating layer 27 and the substrate 25, an element-isolating oxide film, bit lines and word lines are formed. The lower insulating layer 27 is comprised of a planarized, silicon-based oxide film which is made of, for example, tetra ethyl ortho silicate (TEOS) or boro phospho silicate glass (BPSG) exhibiting an excellent flowability. The sacrificial film 31 is comprised of an oxide film whereas the first conduction layer 29 is made of polysilicon.

Using the storage electrode mask 33, the sacrificial film 31 is then etched, thereby forming a sacrificial pattern 31' as shown in FIG. 1B. Thereafter, the storage electrode mask 33 is removed. On the resulting structure, a second conduction layer 35 is deposited to a desired thickness. The second conduction layer 35 is made of polysilicon. The removal of the storage electrode mask 33 is achieved using oxygen plasma.

Thereafter, the second conduction layer 35 is anisotropically over-etched, thereby forming spacers 37, which are formed respectively on side walls of the sacrificial pattern 31', as shown in FIG. 1C. Simultaneously, the first conduction layer 29 is patterned, thereby forming a first-conduction layer pattern 29'. After completing this step, the upper surface of the sacrificial film pattern 31' is exposed.

The exposed sacrificial film pattern 31' is then removed using a wet etching method. As a result, a storage electrode 39 having a cylindrical structure is formed as shown in FIG. 1D. Over the resulting structure, finally, a dielectric film and a plate electrode are formed. Thus, a capacitor is obtained. In this case, the wet etching is carried out using a buffered oxide etchant (BOE) or a hydrofluorine (HF) solution.

Although the capacity fabricated in accordance with the above-mentioned method has an improvement in topology, as compared to cavity type capacitors, this method involves a difficulty to ensure a sufficient capacitance for highly integrated semiconductor devices.

SUMMARY OF THE INVENTION

Therefore, an object of the invention is to solve the above-mentioned problems and to provide a method for fabricating capacitors of a semiconductor device capable of forming storage electrodes having an increased surface area by providing a cylindrical storage electrode structure provided at its each side wall with a vertical groove using a selective growth technique, a wet etching method and conduction layers.

In accordance with the present invention, this object is accomplished by providing a method for fabricating a capacitor of a semiconductor device comprising the steps of: forming a lower insulating layer on a semiconductor substrate, and depositing a first insulating film on the lower insulating layer; forming a contact hole in the resulting structure obtained after the formation of the first insulating film, using a contact mask, such that the semiconductor substrate is partially exposed through the contact hole; forming a first conduction layer on the resulting structure obtained after the formation of the contact hole such that the first conduction layer is in contact with the semiconductor substrate through the contact hole; forming a second insulating film on the first conduction layer, and forming a first storage electrode mask on the second insulating film; selectively growing the second insulating film, thereby forming a selectively-grown oxide film extending to a predetermined height; forming a second storage electrode mask on both the first storage electrode mask and the selectively-grown oxide film such that the second storage electrode mask extends laterally beyond the first storage electrode mask by a predetermined width on each side thereof; sequentially etching the selectively-grown oxide film, the second insulating film and a predetermined portion of the first conduction layer using the second storage electrode mask, thereby forming a selectively-grown oxide film pattern; removing the second storage electrode mask and the first storage electrode mask, and forming a second conduction layer to a predetermined thickness on the resulting structure obtained after the removal of the masks; anisotropically etching the second conduction layer, thereby forming second-conduction layer spacers; etching the second insulating film using the second-conduction layer spacers as a mask, and forming a third conduction layer to a predetermined thickness on the resulting structure obtained after the etching of the second insulating film; anisotropically etching the third conduction layer and the first conduction layer, thereby forming third-conduction layer spacers and a first-conduction layer pattern; and removing the selectively-grown oxide film pattern, the first insulating film and the second insulating film pattern using a wet etching method, whereby a cylindrical storage electrode with an increased surface area is formed.

BRIEF DESCRIPTION OF THE DRAWINGS

Other objects and aspects of the invention will become apparent from the following description of embodiment with reference to the accompanying drawings in which.

DETAILED DESCRIPTION OF THE PREFERRED EMBODIMENTS

FIGS. 2A to 2F illustrate a method for fabricating capacitors of a semiconductor device in accordance with an embodiment of the present invention.

Figure 1A:
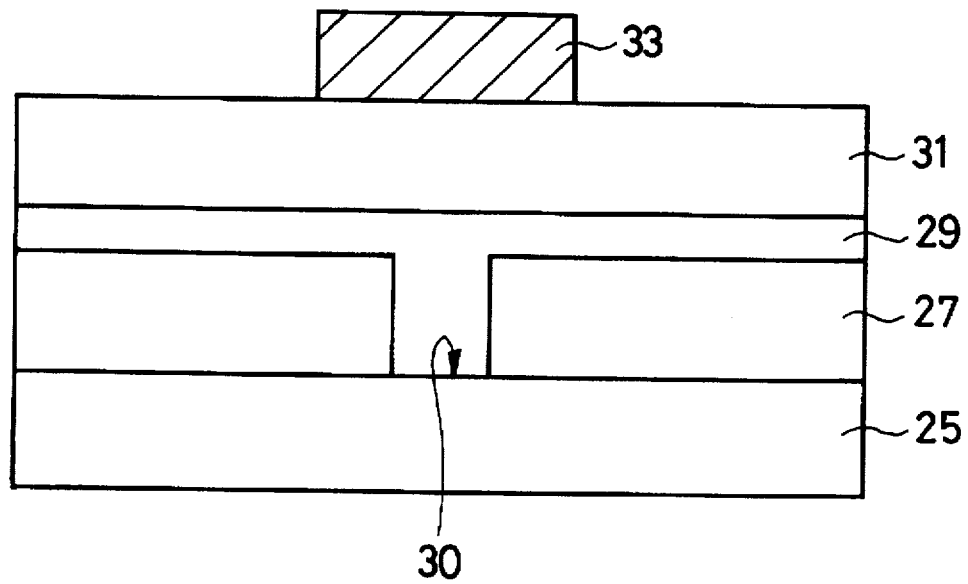
FIGS. 1A to 1D are sectional views respectively illustrating a conventional method for fabricating capacitors of a semiconductor device.
Figure 1B:
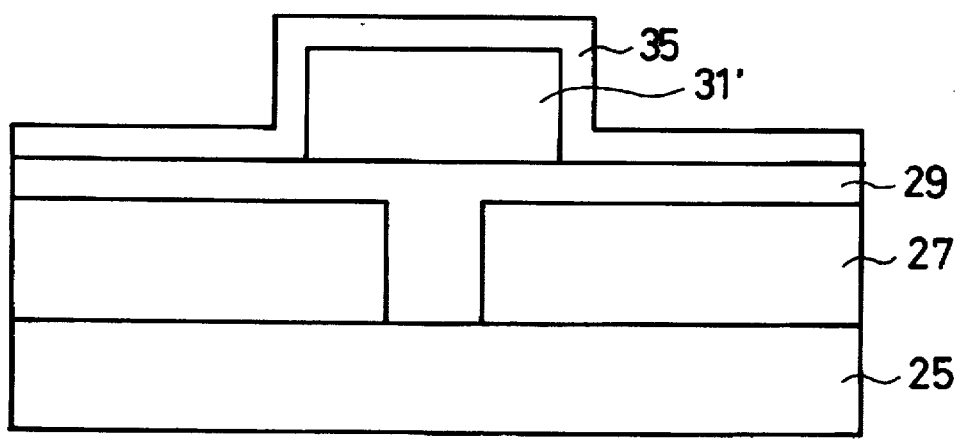
Figure 1C:
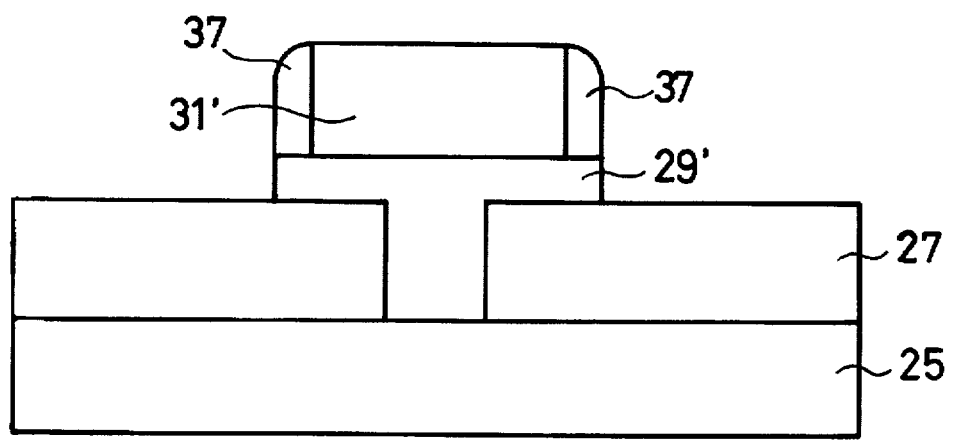
Figure 1D:
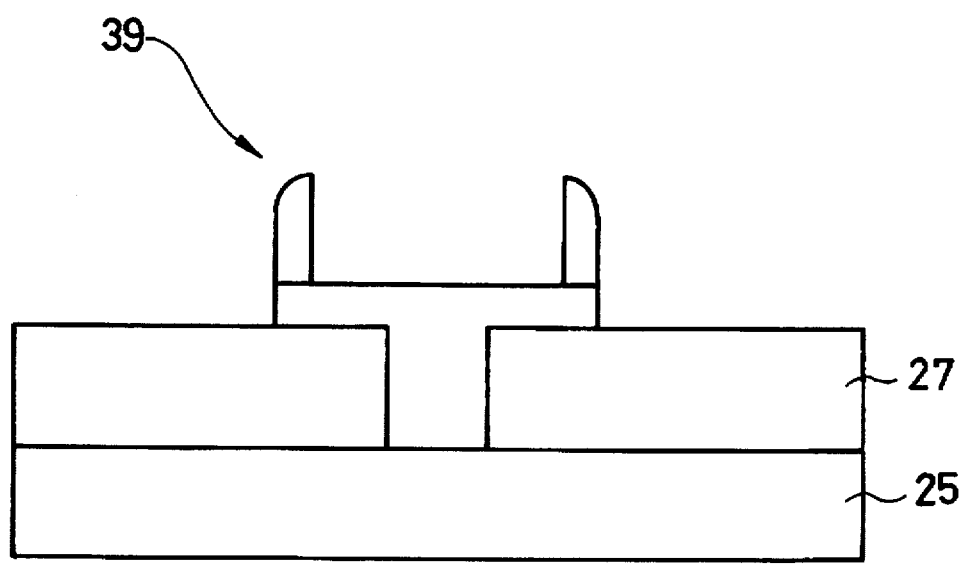
Figure 2A:
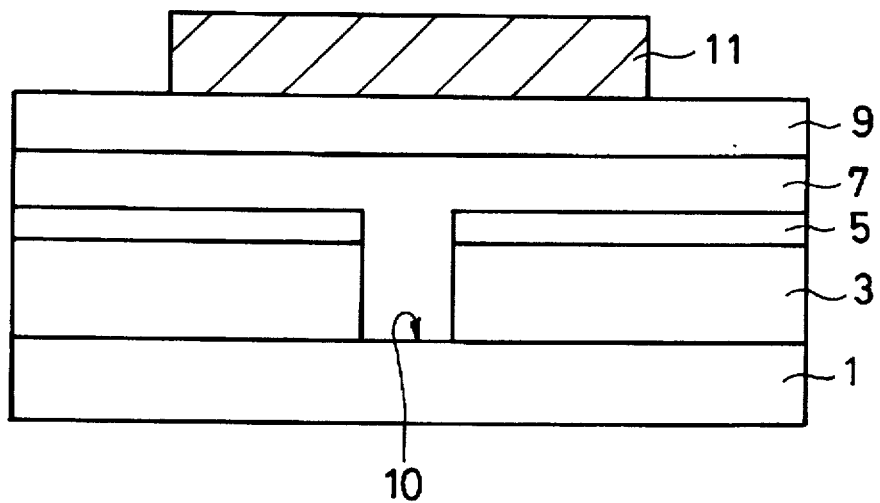
FIGS. 2A to 2F are sectional views respectively illustrating a method for fabricating capacitors of a semiconductor device in accordance with the present invention.

In accordance with the method of the present invention, a semiconductor substrate 1 is prepared and then a lower insulating layer 3 is formed on the semiconductor substrate 1 as shown in FIG. 2A. On the lower insulating layer 3, a first insulating film 5 is then deposited. Thereafter, a contact hole 10 is formed using a contact mask. Through the contact hole 10, a predetermined portion of the semiconductor substrate 1 is exposed. Over the resulting structure, a first conduction layer 7 is deposited so that it is in contact with the exposed portion of the semiconductor substrate 1. A second insulating film 9 is then deposited to a desired thickness over the first conduction layer 7. Subsequently, a first storage electrode mask 11 is formed on the second insulating film 9. Although an element-isolating oxide film, a bit line and a word line are formed between the lower insulating layer 3 and the substrate 1, they are not shown in the figure. The lower insulating layer 3 is comprised of a planarized, silicon-based oxide film which is made of, for example, TEOS or BPSG exhibiting an excellent flowabilty. The first and second oxide films 5 and 9 are comprised of an oxide film whereas the first conduction layer 7 is made of polysilicon.

Figure 2B:
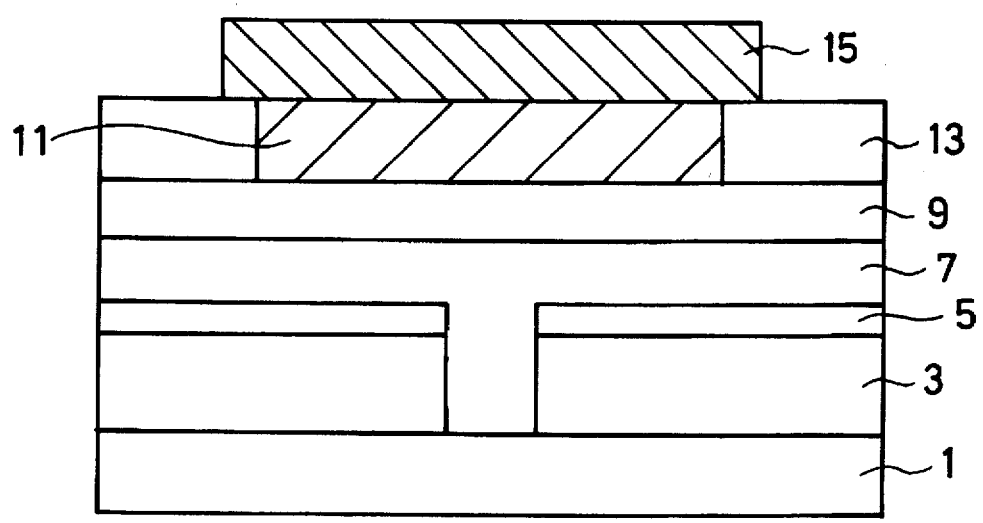

Using the first storage electrode mask 11 as a growth barrier, the second insulating film 9 is then selectively grown to the upper surface of the first electrode mask 11, thereby forming a selectively-grown oxide film 13 as shown in FIG. 2B. Thereafter, a second storage electrode mask 15 is formed on the resulting structure. The second storage electrode mask 15 extends beyond the first storage electrode mask 11 by a predetermined width on each side thereof.

Figure 2C:
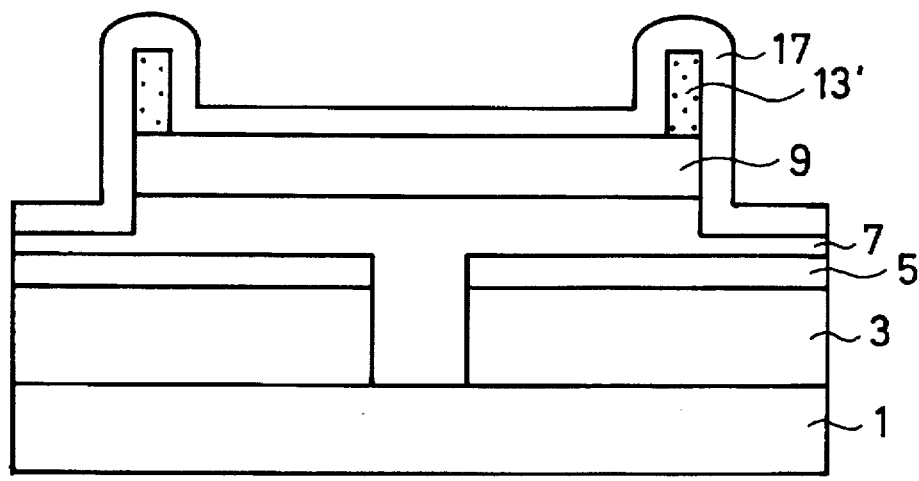

All the selectively-grown oxide film 13, the second insulating film 9 and the first conduction layer 7 are then sequentially etched using the second storage electrode mask 15, thereby forming a selectively-grown oxide film pattern 13' as shown in FIG. 2C. At this time, the first conduction layer 7 is etched to a desired depth such that it remains to a thickness sufficient to protect the first insulating film 5 at a subsequent step of etching the second insulating film 9. Thereafter, both the second storage electrode mask 15 and the first storage electrode mask 11 are removed. Over the resulting structure, a second conduction layer 17 is then deposited to a desired thickness. The removal of the storage electrode masks 11 and 15 are achieved using oxygen plasma.

Figure 2D:
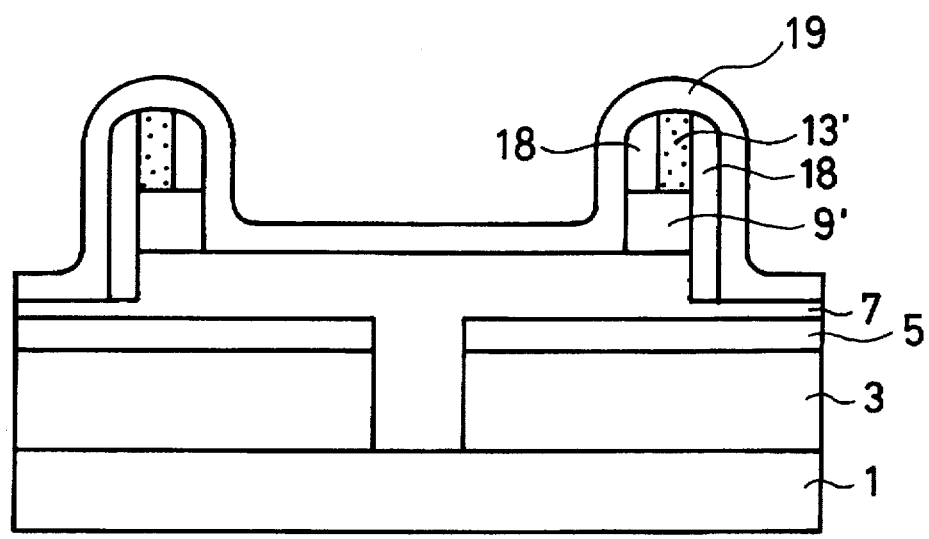

Subsequently, the second conduction layer 17 is anisotropically etched, thereby forming spacers 18, which are respectively formed on side walls of the selectively-grown oxide film pattern 13', as shown in FIG. 2D. Using the second-conduction layer spacers 18 as a mask, the second insulating film 9 is then etched, thereby forming a second-insulating film pattern 9'. Over the resulting structure, a third conduction layer 19 is then deposited to a desired thickness. The etching of the second insulating film 9 is carried out using the first conduction layer 7 as an etch barrier. During the etching, the first insulating film 5 is protected by the first conduction layer 7 having a predetermined thickness.

Figure 2E:
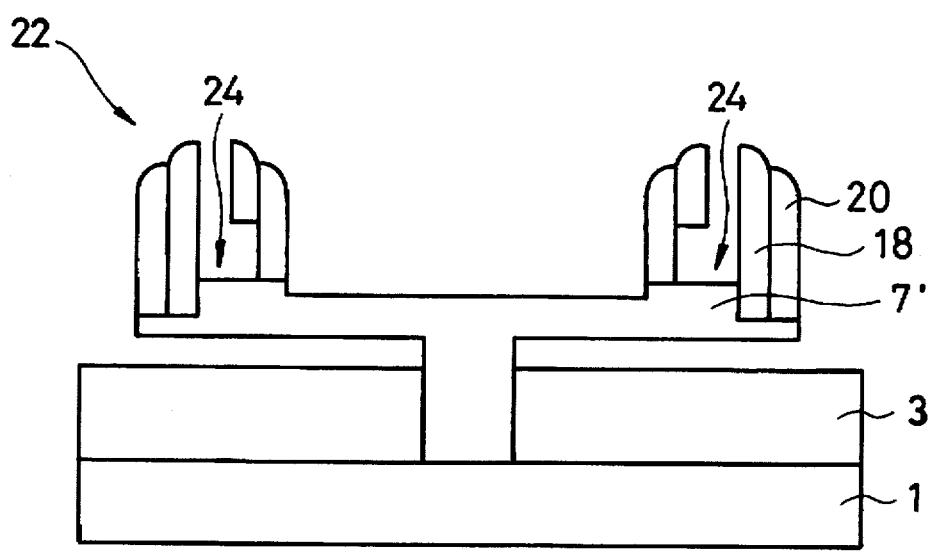

Both the third conduction layer 19 and the first conduction layer 7 are then anisotropically etched to form third-conduction layer spacers 20 and a first-conduction layer pattern 7', as shown in FIG. 2E. The selectively-grown oxide film pattern 13' and the first insulating film 5 are exposed after the anisotropic etching. They are completely removed using the wet etching method. The second-insulating film pattern 9' exposed after the removal of the pattern 13' is also removed. As a result, a cylindrical storage electrode 22 is obtained which has a vertical groove 24 at its each side wall. The wet etching is carried out using a BOE or an HF solution.

Figure 2F:
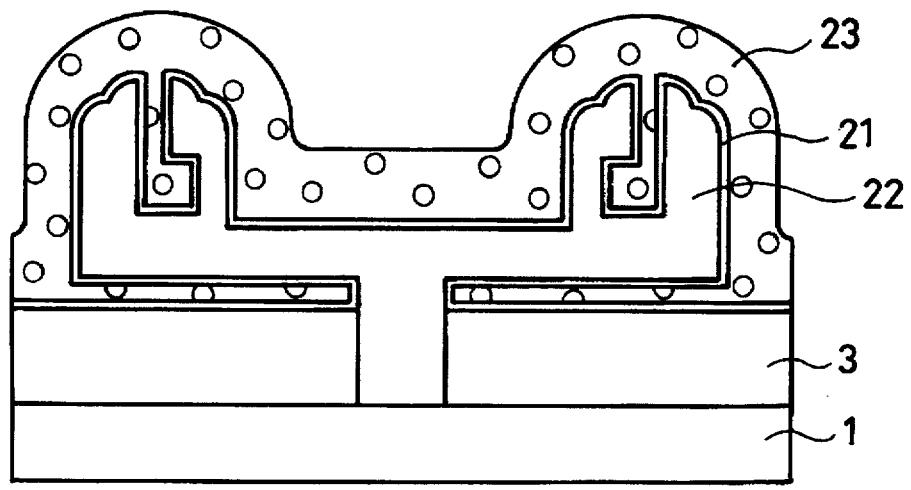

Over the resulting structure, finally, a dielectric film 21 and a plate electrode 23 are formed, as shown in FIG. 2F. Thus, a capacitor is obtained. The dielectric film 21 is comprised of an insulating film whereas the plate electrode 23 is made of a conduction material.

As apparent from the above description, the capacitor fabricated in accordance with the present invention has a cylindrical storage electrode provided at its each side wall with a vertical groove for increasing the surface area of the storage electrode. Accordingly, it is possible to provide a semiconductor device with a sufficient capacitance.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device comprising the steps of:
   forming a lower insulating layer on a semiconductor substrate, and depositing a first insulating film on the lower insulating layer;
   forming a contact hole in the resulting structure obtained after the formation of the first insulating film, using a contact mask, such that the semiconductor substrate is partially exposed through the contact hole;
   forming a first conduction layer on the resulting structure obtained after the formation of the contact hole such that the first conduction layer is in contact with the semiconductor substrate through the contact hole;

forming a second insulating film on the first conduction layer, and forming a first storage electrode mask on the second insulating film;

selectively growing the second insulating film, thereby forming a selectively-grown oxide film extending to a height;

forming a second storage electrode mask on both the first storage electrode mask and the selectively-grown oxide film such that the second storage electrode mask extends laterally beyond the first storage electrode mask by a width on each side thereof;

sequentially etching the selectively-grown oxide film, the second insulating film and a portion of the first conduction layer using the second storage electrode mask, thereby forming a selectively-grown oxide film pattern;

removing the second storage electrode mask and the first storage electrode mask, and forming a second conduction layer to a thickness on the resulting structure obtained after the removal of the masks;

anisotropically etching the second conduction layer, thereby forming second-conduction layer spacers;

etching the second insulating film using the second-conduction layer spacers as a mask, and forming a third conduction layer to a thickness on the resulting structure obtained after the etching of the second insulating film;

anisotropically etching the third conduction layer and the first conduction layer, thereby forming third-conduction layer spacers and a first-conduction layer pattern; and removing the selectively-grown oxide film pattern, the first insulating film and the second insulating film pattern using a wet etching method, whereby a cylindrical storage electrode with an increased surface area is formed.

2. The method in accordance with claim 1, wherein the selectively-grown oxide film is formed using the first storage electrode mask as a growth barrier.

3. The method in accordance with claim 1, wherein the selectively-grown oxide film has a height that its upper surface is flush with an upper surface of the first storage electrode mask.

4. The method in accordance with claim 1, wherein the second insulating film pattern is formed using the second-conduction layer spacers as a mask and using the first conduction layer as an etch barrier.

5. The method in accordance with claim 1, wherein the wet etching method is carried out using a buffered oxide etchant or a hydrofluorine solution.

6. The method in accordance with claim 1, wherein the anisotropically etching step using the second storage electrode mask is carried out such that the first conduction layer remains to a thickness enough to protect the first insulating film at the subsequent step of etching the second insulating film.

* * * * *